United States Patent
Jun

(10) Patent No.: US 7,394,906 B2
(45) Date of Patent: Jul. 1, 2008

(54) DEVICE FOR AUTOMATICALLY CONTROLLING AUDIO VOLUME BASED ON VEHICLE SPEED AND METHOD FOR OPERATING THE SAME

(75) Inventor: Jae Beom Jun, Kyunggi-do (KR)

(73) Assignee: Hyundai Autonet Co., Ltd., Gyeonggi-do (KR)

( * ) Notice: Subject to any disclaimer, the term of this patent is extended or adjusted under 35 U.S.C. 154(b) by 776 days.

(21) Appl. No.: 10/703,604

(22) Filed: Nov. 10, 2003

(65) Prior Publication Data

US 2004/0202337 A1    Oct. 14, 2004

(30) Foreign Application Priority Data

Apr. 9, 2003    (KR)    ................ 10-2003-0022373

(51) Int. Cl.
*H04B 1/00* (2006.01)
*H03G 3/00* (2006.01)

(52) U.S. Cl. .................................... 381/86; 381/104
(58) Field of Classification Search ................ 381/86, 381/102, 104, 107, 108, 56, 58, 59
See application file for complete search history.

(56) References Cited

U.S. PATENT DOCUMENTS

| 5,081,707 A | * | 1/1992 | Schorman et al. | 381/86 |
| 5,204,971 A | * | 4/1993 | Takahashi et al. | 381/86 |
| 5,677,960 A | * | 10/1997 | Unno et al. | 381/86 |

FOREIGN PATENT DOCUMENTS

GB    2 294 769 A  *  5/1996

* cited by examiner

*Primary Examiner*—Ping Lee
(74) *Attorney, Agent, or Firm*—Greenblum & Bernstein, P.L.C.

(57) ABSTRACT

A device for automatically controlling audio volume based on vehicle speed and a method for operating the same keep the car audio volume at a uniform level relative to noise occurring at a level proportional to vehicle speed. The device includes a vehicle speed calculation unit, a car audio device including a speaker, a mode-setting button, and a microcomputer. The mode-setting button is formed on the car audio device at a portion thereof so as to allow a user to set an automatic volume control mode of the car audio device. The microcomputer automatically controls volume of the car audio device so as to output an audio volume corresponding to vehicle speed calculated in the vehicle calculation unit, according to the automatic volume control mode set through the mode-setting button.

11 Claims, 4 Drawing Sheets

DEVICE FOR AUTOMATICALLY CONTROLLING AUDIO VOLUME BASED ON VEHICLE SPEED AND METHOD FOR OPERATING THE SAME

RELATED APPLICATIONS

The present disclosure relates to subject matter contained in Korean Application No. 10-2003-22373, filed on Apr. 9, 2003, which is herein expressly incorporated by reference its entirety.

BACKGROUND OF THE INVENTION

1. Field of the Invention

The present invention relates to a device for automatically controlling audio volume based on vehicle speed and a method for operating the same, and more particularly to a device for automatically controlling audio volume based on vehicle speed and a method for operating the same, wherein the volume of a car audio device is automatically controlled in such a manner that the car audio volume is corrected to keep the car audio volume at a uniform level relative to noise occurring at a level proportional to vehicle speed.

2. Description of the Related Art

With reference to FIG. 1, a conventional device for controlling audio volume in a vehicle is described as follows. FIG. 1 shows the inside space of a general vehicle equipped with an embedded car audio device including a speaker.

Car audio refers to a device designed to allow users in a specified space, the inside space of a car, to listen to powerful sound by improving the performance of audio elements such as a head unit, an amplifier and a speaker, compared to a general home audio system.

The car audio system is classified into two types, one type being a stock type product that is installed directly by a car manufacturer at the time of manufacturing the car (called a "car stereo") and the other being an upgrade or aftermarket type product that is selected by customers (called a "car audio"). The car stereo is an integrated audio system that integrates a tuner for listening to the radio, a deck for listening to a cassette tape and an amplifier into a single unit. On the other hand, the aftermarket car audio system installs an amplifier, a tuner and a deck separately from each other as in a home audio system so as to provide more powerful sound.

Sound generated from a head unit including a tuner, a cassette deck and an amplifier is outputted through a speaker system installed in the inside space of a vehicle, where the speaker system is divided into a front speaker, a rear speaker and a sub woofer according to their installation location.

Such a car audio system has come into wide use in most vehicles since it allows a user inside a moving vehicle to enjoy original sound almost as vivid as home audio, so that a driver can listen to music, a radio broadcast, etc., while the vehicle is moving.

However, as a vehicle travels at high speed, running noise of the vehicle is produced by friction between air and the moving vehicle body and an engine rotating at high speed. That is, as the vehicle speed is increased, noise such as noise due to friction against wind, the vehicle's engine sound and frictional sound of the vehicle's tires is increased in proportion to the vehicle speed, whereas sound produced in the vehicle is relatively weakened due to the increased external noise.

Accordingly, after the volume has been turned up at high traveling speed, since sound outputted from a speaker S of a car audio device is weak, the volume must be turned down when the vehicle travels at low speed or when it is parked or stopped. In particular, in the conventional car audio device, if a driver desires to keep the speaker volume at a uniform level, the driver must manually manipulate a volume control button B to control the volume, which causes inconvenience of manipulation.

In order to manually control the volume, it is necessary for a driver wearing a seat belt to bend his or her upper body, which makes it difficult for the driver to secure his or her field of vision and thus decreases driving concentration, consequently increasing the risk of an accident. In addition, if the volume is not controlled suitably, the driver easily experiences discomfort at his or her ears when he or she listens to the radio or music reproduced through the car audio device, which may reduce the device's utilization rate.

SUMMARY OF THE INVENTION

Therefore, the present invention has been made in view of the above problems, and it is an object of the present invention to provide a device for automatically controlling audio volume based on vehicle speed and a method for operating the same, wherein in consideration of the fact that vehicle noise is produced at a level proportional to the vehicle's traveling speed, the traveling speed of the vehicle is detected to automatically control the volume of a car audio device installed in the vehicle based on the detected vehicle speed, so as to output audio volume at a uniform level relative to the noise without the driver's manual operation.

In accordance with one aspect of the present invention, the above and other objects can be accomplished by the provision of a device for automatically controlling audio volume based on vehicle speed, comprising: a vehicle speed calculation unit for calculating vehicle speed; a car audio device including a speaker for outputting sound; a mode-setting button, formed on the car audio device at a portion thereof, for allowing setting of an automatic volume control mode of the car audio device; and a microcomputer for automatically controlling volume of the car audio device so as to output an audio volume corresponding to the vehicle speed calculated in the vehicle calculation unit, according to the automatic volume control mode set through the mode-setting button.

In accordance with another aspect of the present invention, there is provided a method for operating a device for automatically controlling audio volume based on vehicle speed, comprising the steps of: a) manipulating a mode-setting button provided on a car audio device to select an automatic volume control mode; b) detecting a vehicle's traveling speed; and c) outputting a volume modification value corresponding to both a vehicle speed level of the detected vehicle speed and the selected automatic volume control mode to automatically control audio volume of the car audio device.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
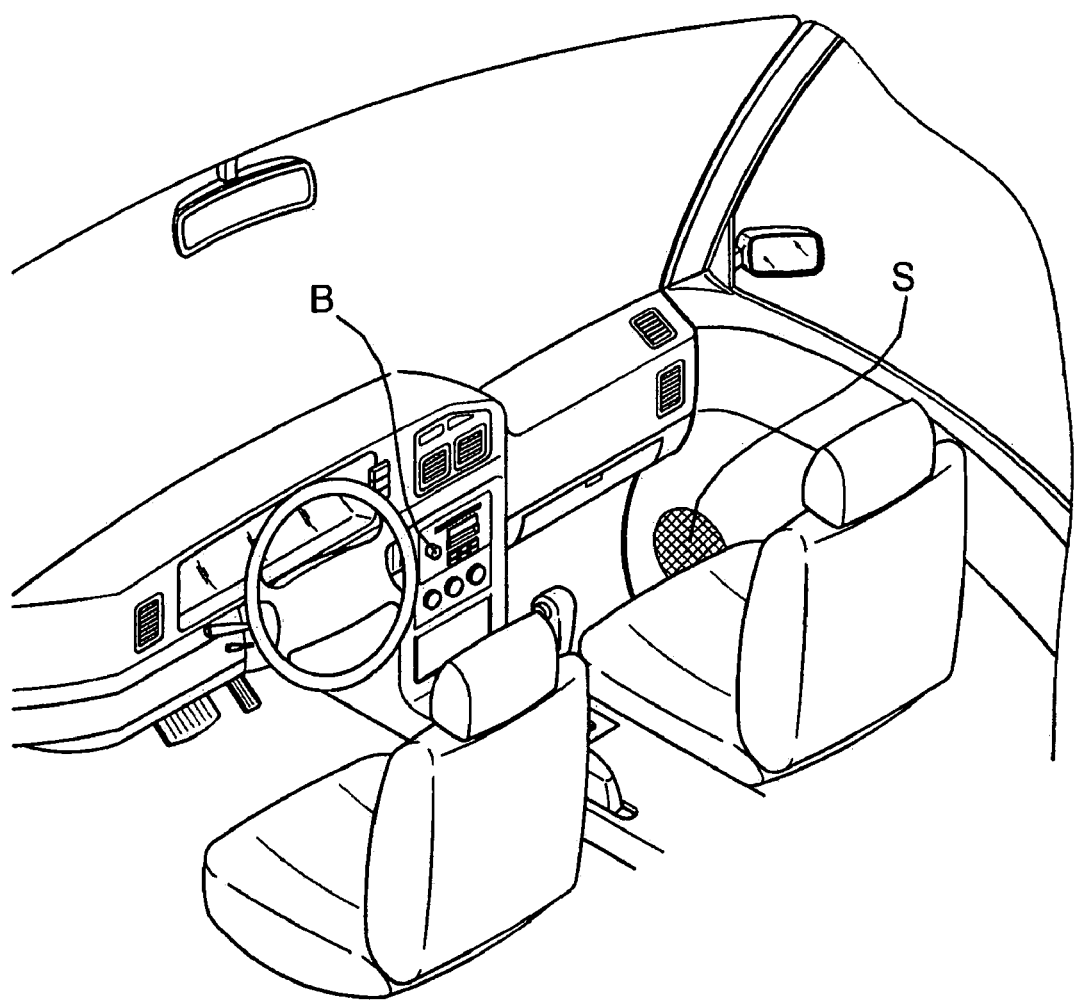
FIG. 1 shows the inside space of a general vehicle.
Figure 2:
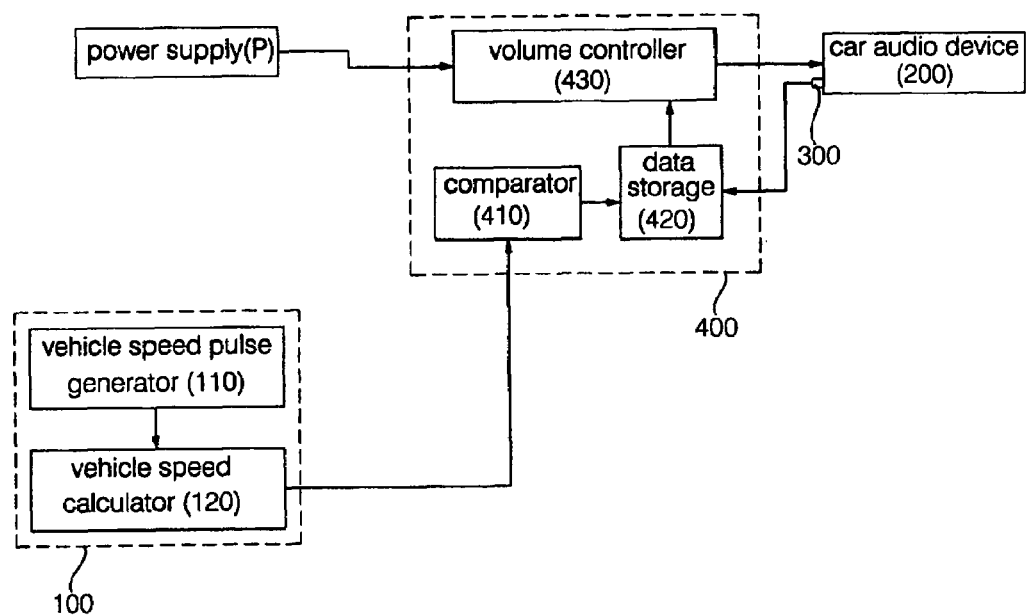
FIG. 2 is a block diagram showing the configuration of a device for automatically controlling audio volume based on vehicle speed, according to the present invention.

Now, preferred embodiments of the present invention will be described in detail with reference to the annexed drawings. FIG. 2 is a block diagram showing the configuration of a device for automatically controlling audio volume based on vehicle speed, according to the present invention.

First, a car audio device 200 is provided in a vehicle, which basically includes a volume control button for allowing users to control audio volume level and a speaker S from which sound is outputted.

In addition, a mode-setting button 300 is provided on the car audio device at an outer portion thereof. The mode-setting button 300 allows a microcomputer operation mode for automatically controlling audio volume of the car audio device 200 to switch between first and second automatic volume control modes, according to the number of times the mode-setting button 300 is manipulated. In the first automatic volume control mode, volume control is performed based on a volume modification value suitable for low noise, and in the second automatic volume control mode, the volume control is performed based on a volume modification value suitable for high noise. In other words, the mode-setting button 300 is connected to the microcomputer 400 to allow a user to select the volume control mode of the microcomputer 400 according to the number of times he or she manipulates the button 300.

A vehicle speed calculation unit 100 includes a vehicle speed pulse generator 100 and a vehicle speed calculator 120. The vehicle speed pulse generator 100 detects the vehicle speed, and outputs a pulse signal according to the detected vehicle speed. The vehicle speed calculator 120 calculates a vehicle speed according to the pulse signal outputted from the vehicle pulse generator 110, and outputs the calculated vehicle speed to the microcomputer 400.

The vehicle speed pulse generator 110 is connected to a vehicle speed detection sensor that is installed inside a speedometer or on a speedometer-driven gear to detect the rotation number of an output gear and thus detect the vehicle speed. The vehicle speed pulse generator 110 generates a pulse signal according to the detection by the vehicle speed detection sensor, and outputs the generated pulse signal to the vehicle speed calculator 120. A vehicle speed pulse generated at low traveling speed has a wide pulse width and thus has a low pulse frequency, whereas a vehicle speed pulse generated at high traveling speed has a narrow pulse width and thus has a high pulse frequency.

The vehicle speed calculation unit 120 calculates the vehicle speed by recognizing the voltage of a pulse outputted from the vehicle speed generator 110. A detailed configuration of the vehicle speed calculation unit 120 is shown in FIG. 3.

Figure 3:
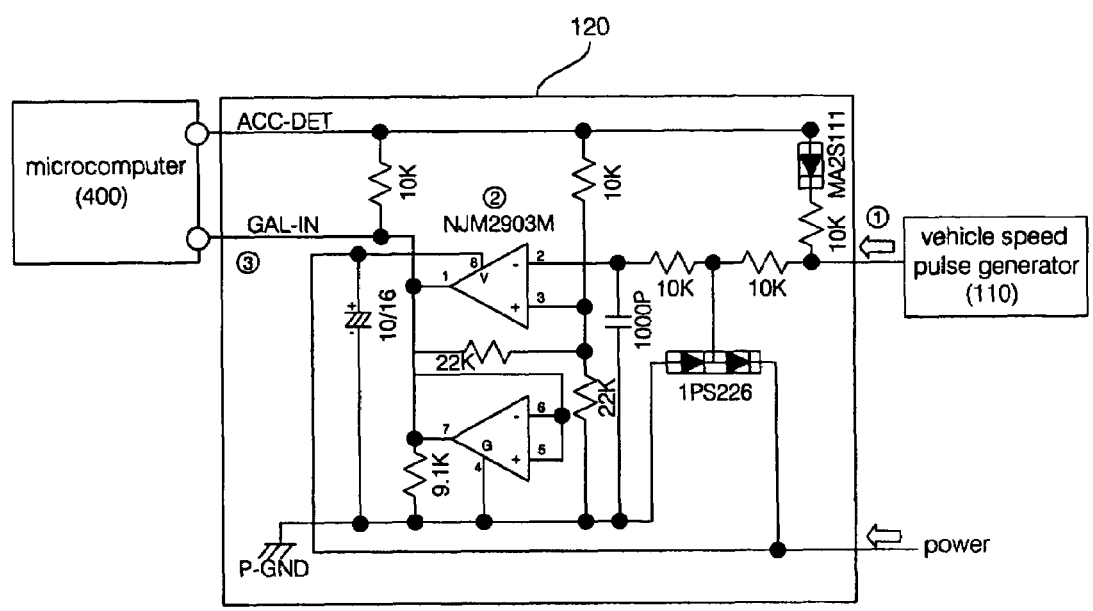
FIG. 3 is a detailed circuit diagram showing a vehicle speed calculation unit of FIG. 2.

As shown in FIGS. 2 and 3, when a pulse signal is outputted from the vehicle pulse generator 110 (denoted by "①"), a single supply comparator to which ACC power is supplied through a power supply unit P recognizes a feature of the outputted pulse signal, i.e., the voltage thereof (denoted by "②"), and outputs a vehicle speed value to the microprocessor 400 (denoted by "③"). The microprocessor 400 calculates a frequency required for the volume control based on the received vehicle speed value, and outputs a volume modification value to control the volume of the car audio device.

The microcomputer 400 (also called an "ECU (Electronic Control Unit)") receives signals from various sensors that function to convert the operating state of an engine into an electrical signal and transfer it to a computer. The microcomputer 400 analyzes and judges the received signals to determine a valve-opening ratio or time of a fuel injector. The microcomputer 400 calculates an optimal state value through a preset program and outputs a control signal to a corresponding device. The configuration of the microcomputer 400 is illustrated in FIG. 3, with reference to a control signal to be transmitted to a car audio device.

As shown in FIG. 2, the microcomputer 400 includes a comparator 410, a data storage unit 420 and a volume controller 430. The comparator 410 determines a vehicle speed level by comparing the vehicle speed calculated in the vehicle speed calculation unit 100 with the vehicle speed level's limit values. The data storage unit 420 stores first automatic volume control data including volume modification values suitable for low noise, and second automatic volume control data including volume modification values suitable for high noise. The volume controller 430 outputs a volume modification value corresponding to the vehicle speed level determined in the comparator 410, among the volume modification values of the first and second automatic volume control data stored in the data storage unit 420, according to an automatic volume control mode set through the mode-setting button 300.

The following Table 1 shows data related to modification values of the audio volume, controlled by the microcomputer 400, with respect to vehicle speeds. The data related to the modification values is stored in the data storage unit 420. According to the volume control mode set through the mode-setting button 300, the microcomputer 400 accesses the data stored in the data storage unit 420 to control the volume of the car audio device 200.

TABLE 1

| mode | | vehicle speed level | 1 | 2 | 3 | 4 | 5 | 6 |
|---|---|---|---|---|---|---|---|---|
| | | upper limit value | 54(37) | 79(54) | 104(71) | 129(88) | 154(106) | 179(122) |
| | | lower limit value | 46(32) | 71(49) | 96(65) | 121(83) | 146(100) | 171(117) |
| 1st automatic volume control mode | volume | | +1 | +2 | +3 | +4 | +5 | +6 |
| 2nd automatic volume control mode | volume | | +3 | +3 | +5 | +6 | +8 | +9 |

The bold and underlined values in this table will now be analyzed for detailed illustration. The microcomputer 400 calculates a vehicle speed level corresponding to a vehicle speed value outputted from the vehicle speed calculation unit 100. That is, if the vehicle speed is in the range of equal to or more than 96 km/h and less than 104 km/h, it is determined that the frequency is suitably in the range of equal to or more than 65 Hz and less than 71 Hz. In this case, the volume modification value is set to "+3" or "+5" as shown in Table 3, and the volume of the car audio device 200 is thus increased by "3" or "5", from the volume previously set in the device 200.

In other words, when the volume control mode is set to the first automatic volume control mode (low noise) by manipulating the mode-setting button 300, the volume modification value is set to "+3", thereby increasing the volume. On the other hand, when the volume control mode is set to the second automatic volume control mode (high noise), the volume modification value is set to "+5", thereby increasing the volume much more. This makes it possible to output audio volume at a uniform level relative to vehicle running noise.

In the meantime, in the case where the detected vehicle speed is out of the range of the vehicle speed levels of Table 1, the volume modification value is set to "0", thereby substantially maintaining the previously set volume.

Figure 4:
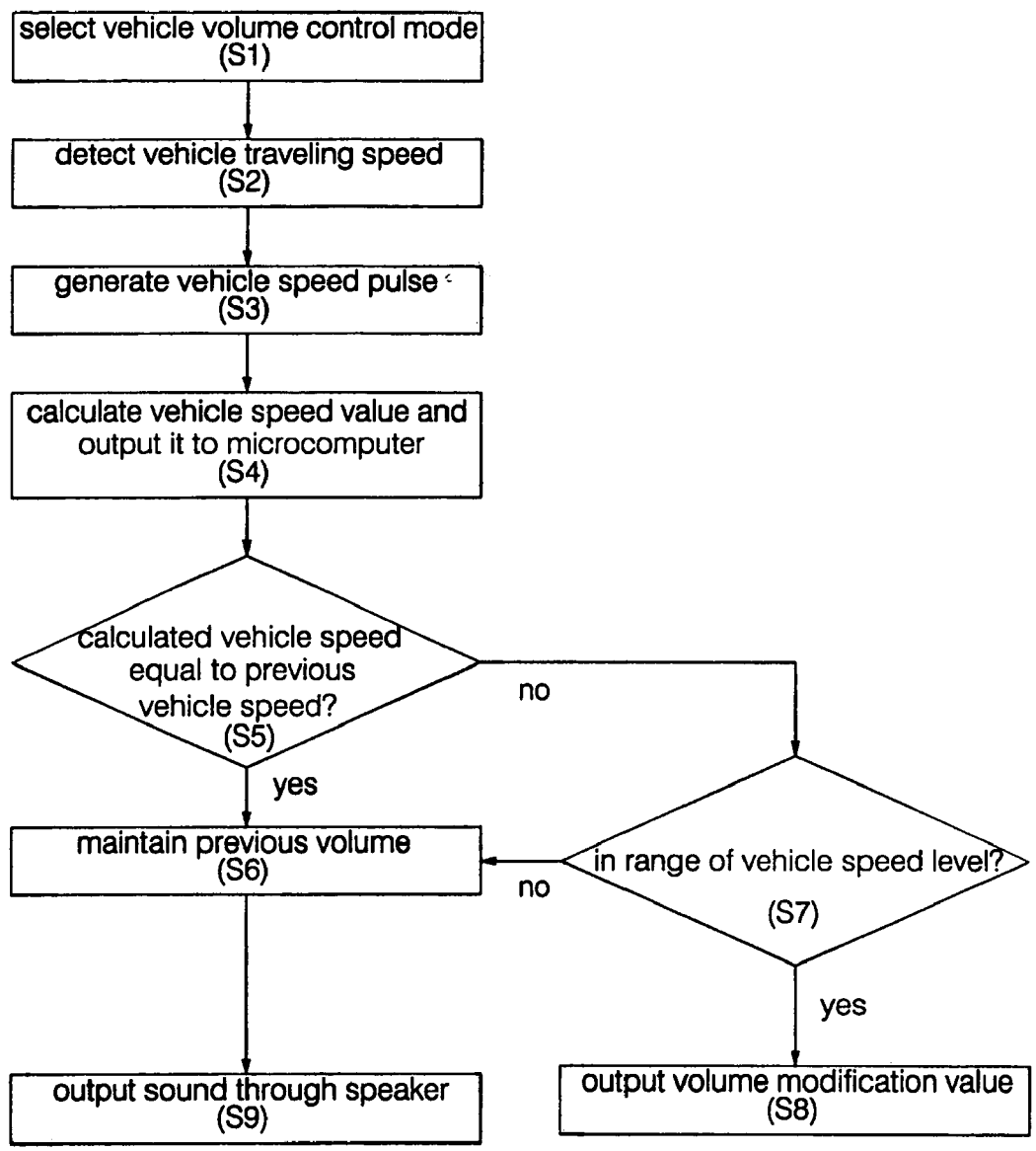
FIG. 4 is a flowchart showing the operation of an automatic volume control device based on vehicle speed according to the present invention.

FIG. 4 is a flowchart showing the operation of an automatic volume control device based on vehicle speed according to the present invention. With reference to this figure, a method for operating the automatic volume control device is described as follows.

First, a driver selects an automatic volume control mode by manipulating a mode-setting button provided in a car audio device. The driver selects a first automatic volume control mode when he or she travels at high speed, whereas the driver selects a second automatic volume control mode when he or she travels at low speed and thus expects high noise (S1).

When a vehicle travels, a vehicle speed detection sensor detects the vehicle's traveling speed (S2), and a vehicle speed pulse is generated and outputted based on the detected vehicle speed signal (S3).

A vehicle speed calculator calculates a vehicle speed according to the voltage of the outputted vehicle speed pulse, and outputs the calculated vehicle speed to a microcomputer (S4).

A comparator in the microcomputer compares the vehicle speed calculated in a vehicle speed calculation unit with the previous vehicle speed to check whether the two vehicle speeds are the same (S5).

When the checked result at step S5 is that the calculated vehicle speed is equal to the previous vehicle speed, the car audio device maintains the previous volume (S6).

On the other hand, when the checked result at step S5 is that the calculated vehicle speed is not equal to the previous vehicle speed, it is checked whether the calculated vehicle speed is in the range of the vehicle speed levels shown in Table 1 (S7).

If the calculated vehicle speed is in the range of the vehicle speed levels, the microcomputer outputs a car audio volume modification value according to the data of modification values stored in a data storage unit (S8).

If the calculated vehicle speed is not in the range of the vehicle speed levels, the procedure returns to step S6, in which the volume modification value is set to "0", thereby keeping the previous volume.

Then, the volume controller allows the car audio device to output the previous or modified audio volume through a speaker (S9).

As apparent from the above description, a device for automatically controlling audio volume based on vehicle speed and a method for operating the same according to the present invention have the following advantages. In order to prevent audio volume outputted from a car audio device from being weakened due to noise occurring at a level proportional to vehicle traveling speed, the audio volume is automatically modified to be outputted, thereby keeping the output volume at a uniform level relative to the noise. In addition, since a driver can select one of the two automatic volume control modes, the volume level is modified while differentiating low and high noise environments from each other, which consequently improves the driver's convenience and increases the utilization rate of the car audio device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for operating a device for automatically controlling an audio volume based on a vehicle speed, comprising:

manipulating a mode-setter provided on a car audio device to select an automatic volume control mode;
calculating a vehicle speed;
determining a vehicle speed level by comparing the calculated vehicle speed with a plurality of limit values of the vehicle speed level; and
outputting a volume modification value related to both the vehicle speed level of the calculated vehicle speed and the selected automatic volume control mode to control the audio volume of the car audio device,
wherein the outputting a volume modification value further includes generating a vehicle speed pulse based upon the calculated vehicle speed, calculating the vehicle speed based upon a voltage of the vehicle speed pulse, and determining a vehicle speed level corresponding to the calculated vehicle speed;
calculating the vehicle speed further includes providing a plurality of resistors connected at a point, and receiving the vehicle speed pulse at the point, connecting at least one diode to at least one of the plurality of resistors, and connecting a plurality of switching diodes to at least a second of the plurality of resistors and to at least another resistor.

2. The method according to claim 1, wherein said outputting further includes outputting a volume modification value of "0", so as not to change the audio volume of the car audio device, when the calculated vehicle speed does not correspond to the compared plurality of limit values of the vehicle speed level.

3. A device for automatically controlling audio volume based on a vehicle speed, comprising:

a vehicle speed calculation unit configured to calculate a vehicle speed;
a car audio device, including a speaker, configured to output a sound;
a mode-setter provided at a portion of the car audio device, configured to allow setting of an automatic volume control mode of the car audio device;
a microcomputer configured to automatically control volume of the car audio device so as to output an audio volume related to the vehicle speed calculated in the vehicle speed calculation unit, based upon the automatic volume control mode set through the mode-setter;

the vehicle speed calculation unit including:
- a vehicle speed pulse generator configured to detect the vehicle speed, and to output a pulse signal based upon to the detected vehicle speed, and
- a vehicle speed calculator configured to calculate the vehicle speed according to the output pulse signal from the vehicle speed pulse generator, and output the calculated vehicle speed to the microcomputer;

the vehicle speed calculator including:
- a first resistor and a second resistor connected at a point, the output pulse signal from the vehicle speed pulse generator being received at the point;
- a first diode connected to the first resistor; and
- a switching pair of diodes connected to the second resistor and a third resistor.

4. The automatic volume control device according to claim 3, wherein the microcomputer includes a comparator configured to determine a vehicle speed level by comparing the vehicle speed calculated in the vehicle speed calculation unit with a plurality of limit values of the vehicle speed level.

5. The automatic volume control device according to claim 3, wherein the vehicle speed calculator calculates the vehicle speed based upon a voltage of the output pulse signal from the vehicle speed pulse generator.

6. The automatic volume control device according to claim 3, wherein the mode-setter is further configured to allow an audio volume control mode of the microcomputer to switch between a first automatic volume control mode, in which the audio volume control is performed based on a volume modification value suitable for low noise, and a second automatic volume control mode, in which the audio volume control is performed based on a volume modification value suitable for high noise, according to the number of times the mode-setter is manipulated.

7. The automatic volume control device according to claim 6, wherein the microcomputer includes:
- a data storage configured to store first automatic volume control data, including the volume modification value suitable for low noise, and a second automatic volume control data including volume modification values suitable for high noise; and
- a volume controller configured to control the audio volume by outputting a volume modification value related to the vehicle speed level determined in the comparator, among the volume modification values of the first and second automatic volume control data stored in the data storage unit, based upon the automatic volume control mode set through the mode-setter.

8. The automatic volume control device according to claim 7, wherein when the calculated vehicle speed does not correspond to the vehicle speed level determined in the comparator, the volume controller outputs a volume modification value of "O" to keep the audio volume at a previous level.

9. The device according to claim 7, wherein the first automatic volume control data and the second automatic volume control data include the plurality of limit values, the plurality of limit values being a plurality of discrete upper limit values and a plurality of discrete lower limit values.

10. The device according to claim 3, the vehicle speed calculator further comprising:
- a capacitor connected to the third resistor and the switching pair of diodes;
- a first voltage comparator connected to the capacitor; and
- a second voltage comparator connected to the capacitor,
- wherein the output from the first and second voltage comparators are connected to an input of the microcomputer.

11. The device according to claim 3, wherein a pulse width of the output pulse signal varies as a function of the vehicle speed.

* * * * *

UNITED STATES PATENT AND TRADEMARK OFFICE
CERTIFICATE OF CORRECTION

| | |
|---|---|
| PATENT NO. | : 7,394,906 B2 |
| APPLICATION NO. | : 10/703604 |
| DATED | : July 1, 2008 |
| INVENTOR(S) | : J. B. Jun |

It is certified that error appears in the above-identified patent and that said Letters Patent is hereby corrected as shown below:

At column 7, line 4 (claim 3, line 18) of the printed patent, after "upon" delete "to".

Signed and Sealed this

Twenty-fourth Day of February, 2009

JOHN DOLL
*Acting Director of the United States Patent and Trademark Office*